(12) United States Patent
Melvin et al.

(10) Patent No.: US 6,306,246 B1
(45) Date of Patent: Oct. 23, 2001

(54) DUAL WINDOW OPTICAL PORT FOR IMPROVED END POINT DETECTION

(75) Inventors: Paul H. Melvin, Austin; Terry L. Lutrick, Manchaca; Chris Shannon, Dripping Springs, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/484,372

(22) Filed: Jan. 14, 2000

(51) Int. Cl.[7] ................................ C23F 1/02; C23C 16/00
(52) U.S. Cl. ......................... 156/345; 118/713; 118/712
(58) Field of Search .................................. 118/713, 712; 156/345

(56) References Cited

U.S. PATENT DOCUMENTS

| | | | |
|---|---|---|---|
| 3,170,383 | * 2/1965 | Hunt | 118/713 |
| 5,830,277 | * 11/1998 | Johnsgard et al. | 118/725 |
| 5,880,850 | * 3/1999 | McAndrew et al. | 356/437 |
| 6,129,807 | * 10/2000 | Grimbergen et al. | 156/345 |
| 6,159,297 | * 12/2000 | Herchen et al. | 118/708 |
| 6,207,008 | * 3/2001 | Kijima | 156/626.1 |
| 6,235,119 | * 5/2001 | Yang | 118/722 |

FOREIGN PATENT DOCUMENTS 58-6124 * 1/1983 (JP) .
62-42514 * 2/1987 (JP) .
5-345974 * 12/1993 (JP) .

* cited by examiner

Primary Examiner—Jeffrie R. Lund
(74) Attorney, Agent, or Firm—Kevin L. Daffer; Conley, Rose & Tayon P.C.

(57) ABSTRACT

The present invention teaches an apparatus and method for preventing the accretion of opaque material on an optical port of a reaction chamber by using a dual-window optical port to maintain a heated gas flow in contact with the windows of the dual-window optical port. The dual-window optical port can be an end point window, a viewing port, or any optical port for which accretion of an opaque material is unwanted. The opaque material can include reaction byproducts such as polymer or any other chemical species present in the chamber. The gas flow preferably includes an inert gas such as compressed dry air. The apparatus preferably includes a housing for maintaining a spaced pair of windows in optical alignment. Ideally, one of the windows is an existing optical port built into the chamber, and the housing is mounted on the chamber over the built-in optical port to form an enclosure or cavity about the optical port. The housing ensures that the heated gas flow will remain in contact with the optical port for a time sufficient to achieve uniform heating of the optical port. The housing includes a gas inlet for admitting a gas flow into the enclosure and a gas outlet for releasing the gas flow from the enclosure. One end of gas conduit is coupled to the gas inlet with the other end coupled to a gas source for delivering the heated gas flow through the gas conduit and the gas inlet into the enclosure.

11 Claims, 3 Drawing Sheets

DUAL WINDOW OPTICAL PORT FOR IMPROVED END POINT DETECTION

BACKGROUND OF THE INVENTION

1. Field of the Invention

This invention generally relates to the field of semiconductor processing and more particularly to improving end point detection by preventing the accretion of by-products on end point windows.

2. Description of the Relevant Art

Fabrication of an integrated circuit entails the sequencing of numerous processing operations. During the manufacture of an integrated circuit various layers of dielectric, polysilicon, and metal are deposited, doped, patterned, etched, and polished to form specific features of the circuit such as gates, interconnects, and contacts. For some of these processes, determining the end point of the processing cycle plays an important role in achieving high throughput and run-to-run reproducibility. Ideally, the end point of a processing cycle could be theoretically predicted as a function of the parameters that effect the processing environment. In this way, a semiconductor processing tool could be calibrated to terminate a processing step at a predetermined time corresponding to the end point of the processing cycle. However, because it is difficult to control all of the process parameters that affect the end point of a cycle, precise calibration is not always feasible.

To provide a more reliable means for end point detection, reaction chambers are typically designed with a window or optical port for use in conjunction with an external end point detector. End point windows are utilized in a wide variety of semiconductor processing tools including etch tools. Generally an end point detector includes an optical sensor positioned outside the window to receive light from inside the reaction chamber. Changes in the characteristics of the light signal that the end point of the processing cycle has been reached. However, chemical reactions ongoing during processing can lead to the buildup of opaque material such as polymer on interior surfaces of the reaction chamber including the end point window. Over time polymer accumulates on the end point window. Eventually, after a number of processing runs the window becomes so dirty that the optical sensor cannot accurately detect when the processing cycle ends (i.e. the end point).

One process for which end point detection is critical is dry etching, also known as plasma etching. The plasma etch process removes a patterned material from the surface of an underlying thin film using gases as the primary etch medium and plasma energy to drive the reaction. As integrated circuit technology pushes further into the sub-micron device realm, dry etching has become a mainstay process in semiconductor fabrication. This is because dry etching is generally anisotropic, allowing the controlled formation of devices with small feature dimensions. Careful monitoring of the end point of a dry etch cycle is essential to achieving high yield goals. Otherwise, overetch in a directional (anisotropic) pattern can damage underlying features.

There are basically three methods of optical end point detection: (1) optical emission spectrometry; (2) laser interferometry and reflectance; and (3) direct observation of a process through a viewing port by a human operator. See, e.g., Wolf, Silicon Processing in the VLSI Era, pp. 565–567 for a general discussion of these methods of end point measurement. The most common method for determining the end point of a dry etch is optical emission spectrometry. Optical emission spectroscopy is well known in the etching arts as a method for determining the end point of dielectric, polysilicon, and metal etches. Reactants and products in the plasma emit light at characteristic wavelengths in transitioning from excited states. The emission intensity at a given wavelength depends on the relative concentration of the species in the plasma that is emitting the light. As the etch progresses, changes in etch chemistry can be observed by monitoring changes in emission intensity of the plasma components. Thus, in the absence of the material to be etched the reactant concentration will be at some equilibrium value. However, as the desired material is being etched, the concentration of reactant species will be at a lower level than it would in the absence of the etched material. When the end point is reached and the etch material has been consumed, the reactant concentration should increase back to its equilibrium value. By calibrating the optical sensor in the presence and absence of the etch material to the signature spectrum of the reactant, the end point can be determined. In a like manner, product species of the etch process can be used to determine the end point of the etch. Optical emission spectroscopy provides a highly sensitive means for determining end points, which presents a further advantage in being easy to implement.

Another method of optical end point detection uses laser interferometry and laser reflectance. An end point detector utilizing laser interferometry and reflectance focuses a laser on a flat region of a film being etched and measures the intensity of light reflected by the film. Whether interferometry or reflectance is used depends on the properties of the layer being etched. Laser interferometry is appropriate when a transparent film such as $SiO_2$ is being etched, and laser reflectance is utilized when a nontransparent film is being etched. A number of drawbacks are associated with laser interferometry and reflectance. For example, these techniques may not be useful if a large batch of wafer is being etched because these techniques require that a laser be trained on a specific area of a single wafer. Etching information provided by these methods is limited to that confined area of the single wafer on which the laser is focused. Thus, in the case where a large batch of wafers is being processed, laser interferometry and reflectance cannot compensate for non-uniformities in the batch etching process.

The final method of optical end point detection relies on the human eye as the optical sensor. A human operator monitoring the etch process observes the wafer surface being etched through a viewing port on the etch chamber. Direct observation by a human observer is the least reliable of the popular end point detection methods.

While end point detection methods that rely on optical sensing present individual advantages and problems, all suffer from a common drawback attributed with polymer accretion on the end point window. When the window becomes so dirty that end point detection fails, processing must be terminated. In order to restore adequate end point detection capabilities, the etch tool must be opened, cleaned, and requalified to run. A similar procedure is followed for other semiconductor processes that use an optical port as part of an end point detection scheme.

Cleaning and requalifying the etch tool can waste over twelve hours of production time. To avoid costly shutdowns and improve throughput and run-to-run reproducibility, a number of methods have been employed in the past to reduce the problem of polymer accretion on end point windows. One method found in the prior art relies on mechanically wiping or scraping away polymer that has accumulated on the end point window. For example, an etch tool may be modified with a windshield wiper type of device. Such a device essentially consists of an axle passing through the wall of the etch tool near the end point window. The end of the axle extending outside the etch tool is fitted with a knob, and the other end of the axle protruding into the reaction chamber is fitted with a scraper. By turning the knob located on the outside of the tool the scraper rotates and removes accumulated polymer. The principle problem associated with using this type of polymer removal method is contamination of the processing environment. Particulates of polymer that have been scraped off of the window may gravitate towards and accumulate on the wafers being processed providing an undesirable contamination source.

Another method for dealing with polymer accretion on end point windows operates by covering the inside of the window until an end point measurement is to be made. One type of apparatus that could be used in this method is a shutter. During an etch process, the shutter would be in a closed position covering the end point window. In this way, polymer accumulates on the shutter instead of the window. Periodically the shutter would be opened to make an end point measurement. While this method avoids the particulate contamination problem of the scraper method, it suffers from other problems. First, a precise calculation of the end point time is not feasible for reasons already outlined. Therefore, the exact point at which the shutter should be opened cannot be accurately predicted. For this reason, attempting to time the opening of the shutter with the end point is likely to result in over etching. To deal with end point uncertainty and to avoid over etching the shutter will have to be remain open for a long interval around the average end point time, or the shutter will have to be opened frequently during this interval. However, when the shutter is open polymer will still buildup on the window. As the number of processing runs increases, the cumulative open shutter time will lead to some point where end point detection fails because of polymer accretion.

Yet another method for solving the polymer accretion problem uses heat to clean or prevent polymer buildup on end point windows. Polymer will not form on a window that is heated to a sufficient temperature. Moreover, once polymer does form on an end point window heat can drive away the polymer. Of course, burning off the polymer once it has formed on the window can lead to particulate contamination of the wafers being processed. Thus, prevention is preferred over cleaning. Consequently, heating the end point window can avoid the problems accompanying the use of scrapers or shudders. To date, end point windows have been heated via resistive heating of the metal surrounding the window. For example, a wire could be coiled around the window in contact with the metal surrounding the window. A high voltage source would then produce the heating current in the wire. Heat conducts through the metal to the window. End point windows can be made of glass or quartz. However, because glass and quartz are poor thermal conductors, uneven heating of the window will result with less heat being conducted to the inner portion of the window. For this reason, current heating methods for preventing polymer accretion on end point windows are useful for small windows. For larger windows, polymer will still tend to form in the center of the window. This can cause problems for end point detectors where optical sensors must be trained on a specific area of the wafer in the reaction chamber.

Another problem associated with resistive heating involves the placement of the high voltage source near the window. The high voltage may interfere with the end point detector, so that inaccurate measurements are made on the end point of the processing cycle. It would be advantageous to prevent the accretion/accumulation of opaque material such as polymer on an end point window by uniformly heating the window without relying on high voltage resistive heating.

Other optical ports may be incorporated into a semiconductor processing tool for viewing aspects of the process other than end point detection. Therefore, it would be advantageous to have a general method and apparatus for preventing unwanted accretion of opaque material on any optical port, not merely those used for end point detection.

SUMMARY OF THE INVENTION

The problems outlined above are largely overcome by using an optical port having a dual window construction adapted to maintain a supply of heated gas between the two windows. The optical port may be an end point window, a view port, or any optical port for which accretion of opaque material is unwanted. The opaque material may include reaction byproducts such as polymer or any other chemical species present in the chamber. Maintaining a heated gas in contact with the windows of the optical port significantly reduces the accretion of opaque material on the optical port, thereby achieving higher throughput and run-to-run reproducibility.

According to an embodiment, an optical port that inhibits the formation of opaque material thereupon includes a spaced pair of windows separated by a housing member. A first window resides in an opening in a wall of a chamber, such as a process chamber. The first window is preferably an end point window. More generally, the first window may be a view port or any other optical port configured into a chamber. The second window is located a spaced-distance from the first window. The distance between the first and second windows is preferably fixed, but may be adjustable. The first and second windows are preferably maintained in optical alignment by the housing member. The housing member has a first opening adapted to receive the first window and a second opening adapted to receive the second window. The combination of the first and second windows and the housing member defines an enclosure. One or more, gas inlets and gas outlets are configured into the housing member. The housing member includes at least one gas inlet for admitting a heated gas flow into the enclosure and at least one gas outlet for releasing the heated gas flow from the enclosure.

One or more gas conduits may be employed to facilitate gas delivery to the enclosure. In a preferred embodiment, one end of a gas conduit is coupled to a gas inlet on the housing member. The other end of the gas conduit is coupled to a gas delivery system, which delivers a heated gas flow through the gas conduit and the gas inlet into the enclosure defined by the housing member and spaced pair of windows.

Another embodiment of the presently disclosed device may include a second gas conduit having one end attached to a gas outlet on the housing member and the other end attached to the gas delivery system. With this closed-system configuration, gas flowing through the system may be recycled. One advantage of recycling the gas flow is the reduction in the amount of gas used to heat windows of the optical port and the commensurate cost savings associated with such a reduction. Another advantage of a closed system is preventing the source gas from mixing with the ambient atmosphere.

Yet another embodiment of the presently disclosed device includes an optical sensor positioned outside the second window of the optical port so as to receive light emanating from the chamber. In a preferred embodiment in which the optical port is an end point window, the optical sensor is an end point detector that detects changes in the characteristics of the light produced in the chamber, which signal the end of a process occurring in the chamber. Alternatively, the optical sensor may be an operator viewing the chamber interior through the optical port in the case where the optical port is a view port.

A method is also contemplated herein for preventing accretion of opaque material on an optical port of a chamber during a processing operation. This method is especially suitable for improving end point detection in semiconductor processes. Etch processes, for which material buildup on end point windows can prevent reliable end point detection, represent a preferred class of process operations. According to a preferred method, a first window is provided, which seals an opening in a chamber wall. A second window is placed in optical alignment with the first window using a housing member designed to accommodate the first and second windows. One end of a gas conduit is coupled to a gas inlet configured into a wall of housing member, and the other end of the gas conduit is coupled to a gas delivery system. The heated gas flow is then delivered from the gas source through the gas conduit and gas inlet into the housing member. The inner walls of the housing member together with the first and second windows form an enclosure that confines the heated gas flow in contact with the first window. Finally, the heated gas flow is released through a gas outlet configured into a wall of the housing member.

The gas delivery system delivers the heated gas flow at a controlled temperature and at a controlled rate. The gas delivery system preferably includes a heater, a temperature controller, a gas source, and a flow regulator. The temperature controller controls the temperature of a heating element located in the heater. Before delivering the heated gas flow from the gas delivery system, a prevention temperature and corresponding gas flow rate may be determined for preventing accretion of opaque material on the first window. The prevention temperature and corresponding gas flow rate will depend on the particular semiconductor processing operation undertaken. Determining the gas temperature and gas flow rate can be achieved by setting the gas temperature and varying the gas flow rate until accretion of opaque material is prevented. Once sufficient gas temperatures and gas flow rates are known, the temperature controller of the gas source can be adjusted to deliver the heated gas flow at a controlled temperature equal to the prevention temperature. Likewise, the flow regulator can be adjusted to deliver the heated gas flow at a controlled flow rate equal to the corresponding gas flow rate. The gas delivered by the gas source is ideally an inert gas such as compressed dry air.

BRIEF DESCRIPTION OF THE DRAWINGS

Other objects and advantages of the invention will become apparent upon reading the following detailed description and upon reference to the accompanying drawings in which.

Figure 1:
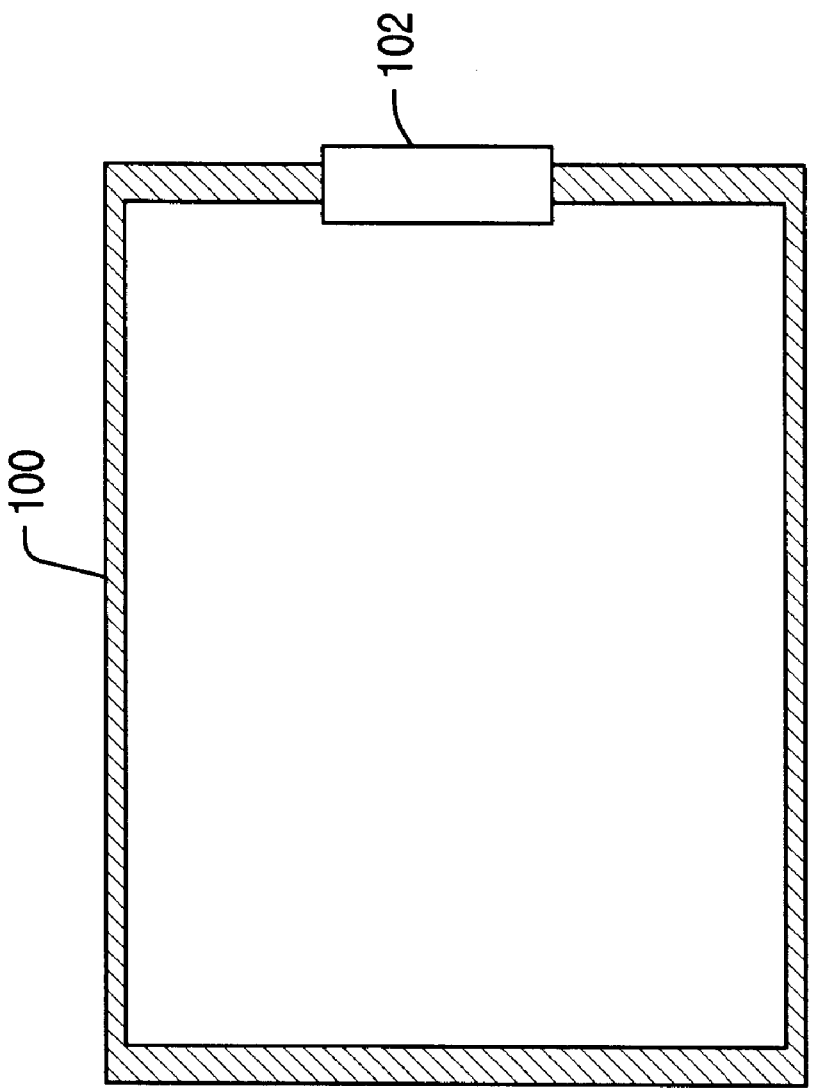
FIG. 1 is a cross-sectional side view of a typical prior art reaction chamber with a built-in optical port.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 shows a cross section of chamber 100 with optical port 102 built into one wall. Chamber 102 can be any chamber in which a process is conducted such that the chemical reactions ongoing during the process lead to the buildup of opaque material on the inner surface of optical port 102. The opaque material will typically be a reaction byproduct such as polymer. However, the opaque material can include any chemical species present during processing. In particular, chamber 100 can be an etch chamber and optical port 102 can be an end point window. For the case of an etch process, the reaction byproduct includes polymer that accumulates on the inner walls of the etch chamber and the end point window. More generally, chamber 100 can be any chamber for use in carrying out a semiconductor processing operation and optical port 102 can be an end point window, a viewing port, or any other optical port incorporated into the design of chamber 100 on which accretion of opaque material is an unwanted side effect.

Figure 2:
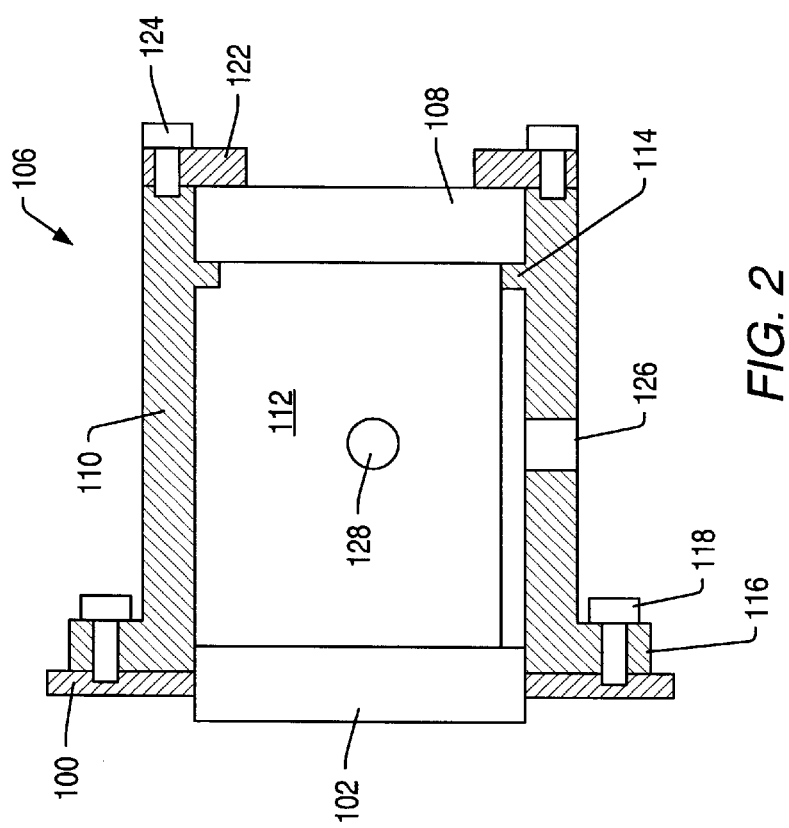
FIG. 2 is cross-sectional side view a dual-window optical port mounted onto the chamber of FIG. 1.
Figure 3:
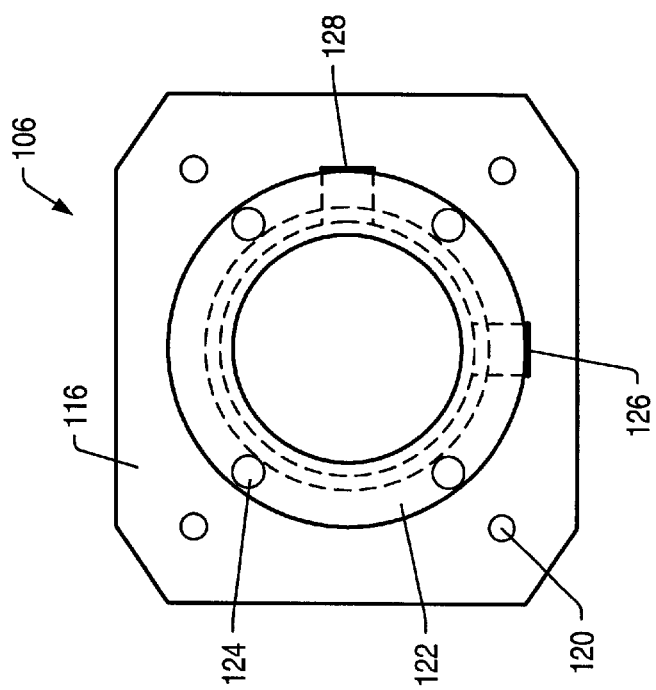
FIG. 3 is a top view of the dual-window optical port shown in FIG. 2.

An embodiment of the presently disclosed apparatus is depicted in FIGS. 2 and 3. FIG. 2 shows a side view of dual-window optical port 106 mounted onto chamber 100. Dual-window optical port 106 includes first and second windows placed in optical alignment a spaced distance apart. The first window is preferably optical port 102. Optical port 102 may be made of any suitable transparent material, such as glass or a high temperature plastic, but is preferably quartz. The second window, optical port 108, may be formed from any suitable transparent material capable of withstanding the temperature of a heated gas flow placed in contact with it. Optical ports 102 and 108 may be formed from the same or different materials. One or both of the optical ports may be a lens. The shape of optical port 102 may vary for different chambers. Thus, for a particular chamber, optical port 102 may be circular, while another chamber, made by the same or a different manufacturer, may be rectangular, or some other shape. In the illustrated embodiment optical ports 102 and 108 are shown having similar dimensions. However, this need not be the case. Thus, in an alternative embodiment, optical port 108 may have a smaller or larger diameter than optical port 102. Likewise, the thickness of the two optical ports do not have to be equal.

Housing 110 maintains optical ports 102 and 108 in spaced, optical alignment. Housing 110 is shown as being roughly a hollow cylinder in shape, with annular side walls defining enclosure 112, but it is appreciated that other shapes are possible. In a general embodiment, the shape of housing 110 may be selected so that the cross-sectional area of hollow region 112 approximately matches the area of optical port 102. Openings are located at either end of housing 110, which are adapted to receive optical ports 102 and 108. One end of housing 110 is designed to fit over optical port 102 and attach to chamber 100. In a preferred embodiment housing 110 fits snugly over optical port 102 so as to form a seal around the port. Although not shown, a gasket may be employed to provide a more effective seal. Attachment of the housing 110 to chamber 102 may be accomplished through various means. According to an embodiment, chamber 100 could be configured with screw holes and mounting portion 116 of housing 110 could then be attached to chamber 100 via screws 118 placed through mounting openings 120. Alternatively, housing 110 may be secured to chamber 100 by securing mounting portion 116 to bolts (not shown) protruding from chamber 100 through mounting openings 120. Yet another alternative mounting means includes forming a threaded collar on chamber 100 around optical port 102; forming a complementary thread in mounting portion 116; and then screwing housing 110 directly onto chamber 100.

Metal may be used in fabricating housing 110. However, in the case where an optical sensor, such as an end point detector, is positioned to monitor a process occuring in chamber 100, use of a conducting material may interfere with the operation of the sensor. In the case of end point detection, placing a conductor near the window can increase the gain on the detector, resulting in a premature end point signal. A similar, but more severe, problem was encountered in prior art techniques which relied on resistive heating to prevent accretion on optical ports because high voltage sources were placed in proximity to the port and end point detector. To avoid interfering with the gain on the end point detector, a nonconducting material is preferred in the construction of housing 110. Alternatively, a high temperature plastic such as ARDEL™ may be employed.

In the embodiment illustrated in FIG. 2, lip 114 is employed to position optical port 108 within housing 110. Lip 114 protrudes from the interior sidewall of housing 110 proximate the opening for optical port 108. Optical port 108 is secured in place using ring 122, which is attached to housing 110 via screws 124. A gasket may be employed to improve the seal between ring 122, optical port 108, and housing 110. In the illustrated embodiment, lip 114 is shown as being located a spaced distance from such opening equal to the width of optical port 108, with ring 122 flush with optical port 108 and the edge of housing 110. In an alternative embodiment, the width of optical port 108 may be less than the distance to lip 114, in which case a portion of ring 122 (not shown) would extend into the opening of housing 110. Yet another alternative embodiment features an optical port 108 with width greater than the spaced distance to lip 114.

Dual-window optical port 106 also includes gas inlet 126 and gas outlet 128. Although only one gas inlet and one gas outlet are shown in FIGS. 2 and 3, it is appreciated that alternative embodiments may feature multiple gas inlets or gas outlets. For purposes of illustration gas inlet 126 and gas outlet 128 are located on the side wall of housing 110 and spaced π/2 radians apart. More generally, the positions of gas inlet 126 and gas outlet 128 can be located anywhere on housing 10 intermediate optical ports 102 and 108.

Figure 4:
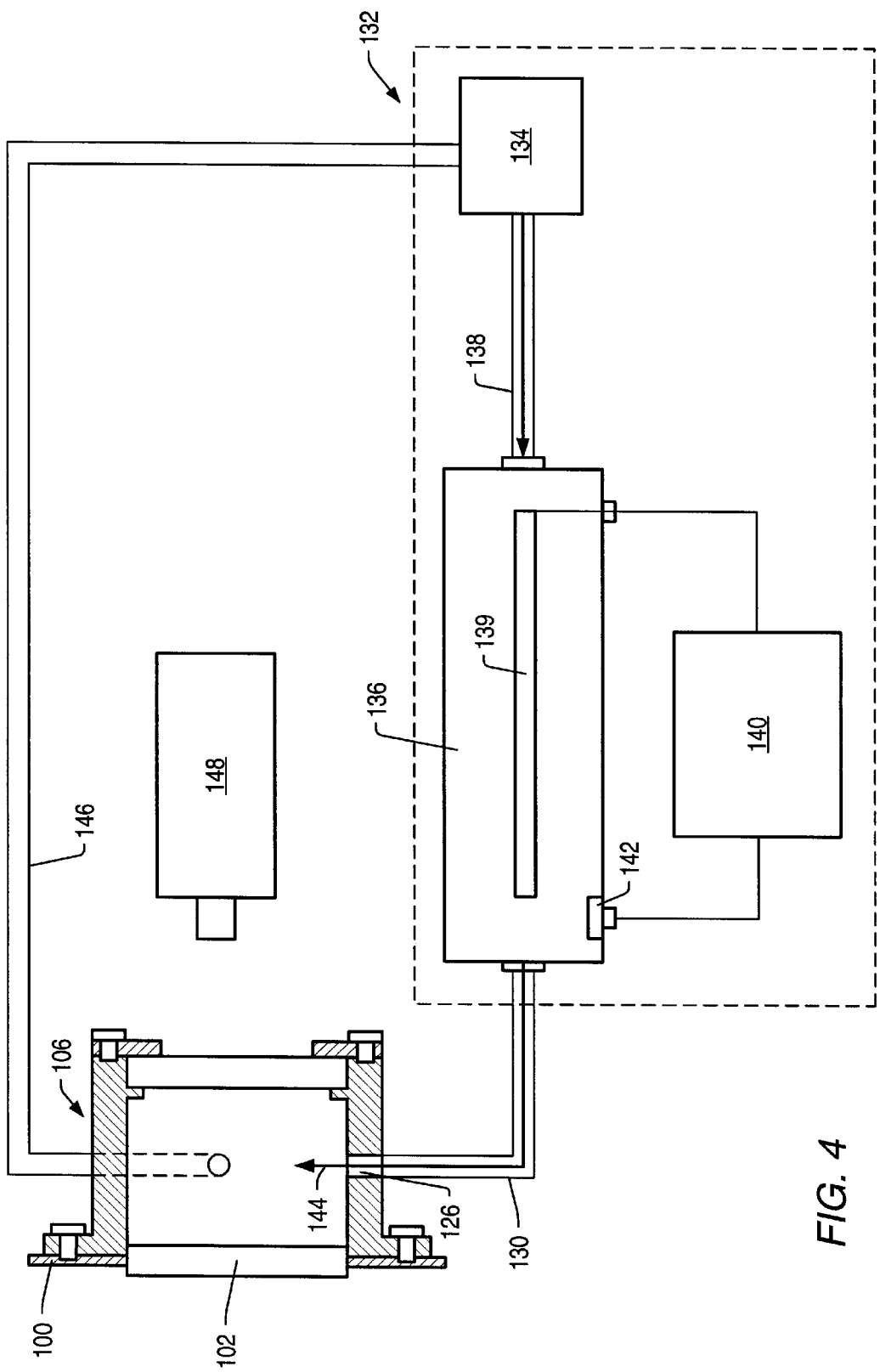
FIG. 4 is a cross-sectional side view of the dual-window optical port of FIG. 2 and a heated gas delivery system coupled thereto for preventing the accretion of opaque material.

Turning to FIG. 4, embodiments of a presently disclosed system for preventing the accretion of opaque material are depicted which utilize dual-window optical port 106. Gas conduit 130 is shown with a first end coupled to gas inlet 126 and a second end coupled to and a second end coupled to gas source/heater 132. Gas source/heater 132 preferably includes: a gas source; a temperature controller for controlling the gas temperature; and a flow regulator for controlling the gas flow rate. A particular embodiment of gas source/heater 132 is illustrated in FIG. 4, which shows gas source 134 coupled to heater chamber 136 via gas supply line 138. Heating chamber 136 encases heating element 139, which is controlled by temperature controller 140. Temperature feedback in heating chamber 136 is provided to temperature controller 140 by temperature sensor 142.

Optical sensor 148 is preferably positioned outside optical port 108 so as to receive light emanating from chamber 100. In a preferred embodiment in which dual-window optical port 106 is an end point window, optical sensor 148 is an end point detector that detects changes in the characteristics of the light produced in the chamber, which signal the end of a process occurring in chamber 100. Placing optical sensor outside of optical port 108 also functions to isolate the end point detector from heat radiating from a heated gas that may be flowing through dual-window optical port 106. It is believed that exposure over a period of time may lead to inaccuracies in the end point signal being measured. Isolating the end point detector from this heat source eliminates this problem.

Optical sensor 148 may be mounted to housing 110 by a bracket. While optical sensor 148 may be permanently mounted in position, a preferable arrangement features an optical sensor that can be easily removed. One advantage of a removable optical sensor is the capability of removing the optical sensor and using the optical port as a view port. This advantage can also be realized by an optical sensor that is designed to be moved out of the way to permit viewing through the optical port. An additional advantage of a removable optical sensor, is the ability to replace the removed optical sensor with another sensor.

FIG. 4 also illustrates a preferred method of using the system pictured therein. Gas source/heater 132 supplies heated gas flow 144, which is delivered through gas conduit 130 and gas inlet 126 into enclosure 112. The gas flow through enclosure 112 may be regulated by varying the diameters of gas inlet 126 and gas outlet 128. Gas outlet 128 may include a valve for adjusting its diameter. The diameter of gas outlet 128 is preferably smaller than the diameter of gas inlet 126 to ensure that heated gas flow 144 remains in contact with optical port 102 to facilitate heating of that optical port.

Before delivering the heated gas flow from the gas source, a prevention temperature and corresponding gas flow rate may be determined for preventing accretion of opaque material on optical port 102. The prevention temperature and flow rate will depend on the particular semiconducting operation undertaken. Determining appropriate gas temperatures and flow rates can be achieved by fixing the gas temperature and varying the gas flow rate until accretion of opaque material is prevented. Once sufficient gas temperatures and flow rates are known, the temperature controller of gas source/heater 132 can be adjusted to deliver heated gas flow 144 at a controlled temperature equal to the prevention temperature. Likewise, the flow regulator of gas source/heater 132 can be adjusted to deliver heated gas flow 144 at a controlled rate equal to the corresponding gas flow rate. The gas delivered by gas source/heater 132 is preferably an inert gas such as nitrogen or argon. More preferably, the gas dispensed by gas source/heater 132 is compressed dry air, which may be vented into the environment immediately external chamber 100 without any extra precautions being taken.

Using compressed dry air, the above technique has been tested in the case where chamber 100 is a metal etch tool; optical port 102 is an end point window; and the ongoing process is an aluminum plasma etch. Prevention temperatures in the range 125–225° C. have been tested with flow rates in the range of 5–8 psi.

The inner walls of housing 110, together with optical ports 102 and 108 form enclosure 112, which constrains heated gas flow 144 to remain in contact with optical port 102. In this manner, heated gas flow 144 is directed at optical port 102. Heated gas flow 144 exits through gas outlet 128 after transferring thermal energy to optical port 102. Heated gas flow 144 is preferably a continuous flow. During processing, an opaque material, such as polymer, will accumulate on the window of optical port 102 facing into chamber 100 unless it is heated by heated gas flow 144. Thus, any interruption in the heated gas flow will cause some amount of opaque material to build up on the optical port. A lengthy interruption can produce a buildup of opaque material capable of preventing accurate endpoint measurements in the case where optical port 102 is an end point window. While a brief interruption in the heated gas flow is unlikely to have a measurable effect on end point detection or viewing, the cumulative effect of many brief interruptions can be problematic. Maintaining heated gas flow 144 as a continuous flow eliminates these problems.

Another embodiment of the present invention includes second gas conduit 146 with one end attached to gas outlet 128 and the other end of second gas conduit 146 coupled to gas source 132. With this configuration, gas flowing through the system is recycled. In the case where a plurality of gas outlets is employed, a plurality of second gas conduits may be required to recycle the gas flow. One advantage of recycling the gas flow is the reduction in the amount of gas used in heating the optical port and the commensurate cost savings. A totally closed system would also prevent gas from escaping into the work environment. Another cost advantage related to recycling the gas flow follows from the fact that less energy will be required to maintain the recycled gas temperature than would be the case with raising the temperature of the non-recycled gas.

The advantages of the presently disclosed method for preventing the accretion of opaque material on an optical port over the prior art are numerous. Utilizing the present method in the context of metal etching, it is found in practice that production time for processing tools is dramatically increased with a commensurate decrease in wafer rate failures. Prior to implementing the method and apparatus of the present invention, 500 plasma hours could be obtained from a metal etch tool before endpoint failed and the metal etch tool had to be shut down and cleaned. The primary cause of end point failure was attributable to the polymer accretion on the end point window preventing reliable and accurate end point detection. In order to restore adequate end point detection capabilities, the etch tool must be opened, cleaned, and requalified to run. Cleaning and requalifying the etch tool can waste in excess twelve hours of production time. Following the implementation of the present method in a metal etch process, end point signal degradation due to polymer accretion was effectively eliminated.

It will be apparent to those skilled in the art having the benefit of this disclosure that the present invention contemplates a method and structure for preventing the accretion of opaque material on an optical port of a reaction chamber.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus for preventing the accretion of opaque material on an optical port, comprising;

a first window, wherein said first window is an optical port on a chamber;

a second window optically aligned with said first window;

a housing member having a first opening adapted to receive said first window and a second opening adapted to receive said second window, wherein said housing member and said first and second windows define an enclosure, and wherein said housing member includes a gas inlet for admitting a heated gas flow into said enclosure and a gas outlet for releasing said heated gas flow from said enclosure.

2. The apparatus of claim 1, further comprising:

a first gas conduit coupled to said gas inlet; and a gas delivery system for delivering said heated gas flow through said first gas conduit and said gas inlet inlet into said enclosure.

3. The apparatus of claim 2, wherein said gas source comprises compressed dry air.

4. The apparatus of claim 2, further comprising a second gas conduit wherein one end of said second gas conduit is connected to said gas outlet and the other end of said second gas conduit is connected to said gas source.

5. The apparatus of claim 1, further comprising one or more additional gas inlets.

6. The apparatus of claim 1, further comprising one or more additional gas outlets.

7. The apparatus of claim 1, wherein said housing member is a bracket configured to fit over said first window.

8. The apparatus of claim 1, wherein the diameter of said second window is equal to the diameter of said first window.

9. The apparatus of claim 1, further comprising a temperature controller for maintaining said heated gas flow at a controlled temperature.

10. The apparatus of claim 1, further comprising an optical sensor positioned outside said second window to receive light emanating from said chamber.

11. The apparatus of claim 10, wherein said optical sensor is an end point detector.

* * * * *